United States Patent
Lee et al.

(10) Patent No.: US 11,450,832 B2
(45) Date of Patent: Sep. 20, 2022

(54) WINDOW MEMBER AND DISPLAY DEVICE WITH WINDOW MEMBER

(71) Applicant: Samsung Display Co., Ltd., Yongin-si (KR)

(72) Inventors: Jungkyu Lee, Incheon (KR);
Seung-Hwan Cho, Yongin-si (KR);
Jonghyeon Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 360 days.

(21) Appl. No.: 16/826,266

(22) Filed: Mar. 22, 2020

(65) Prior Publication Data
US 2020/0365821 A1 Nov. 19, 2020

(30) Foreign Application Priority Data
May 13, 2019 (KR) .................. 10-2019-0055457

(51) Int. Cl.
*H01L 27/32* (2006.01)
*H01L 51/52* (2006.01)

(52) U.S. Cl.
CPC .......... *H01L 51/524* (2013.01); *H01L 27/323* (2013.01); *H01L 27/3244* (2013.01)

(58) Field of Classification Search
CPC .................................................. H01L 27/3244
See application file for complete search history.

(56) References Cited

U.S. PATENT DOCUMENTS

| 9,430,180 | B2 | 8/2016 | Hirakata et al. |
| 10,983,564 | B2 * | 4/2021 | Jin .......................... G09F 9/33 |
| 2015/0138041 | A1 | 5/2015 | Hirakata et al. |
| 2017/0205923 | A1 | 7/2017 | Shim et al. |

FOREIGN PATENT DOCUMENTS

| KR | 10-2015-0136317 | 12/2015 |
| KR | 10-2017-0085344 | 7/2017 |
| KR | 10-2018-0128517 | 12/2018 |

* cited by examiner

*Primary Examiner* — Vip Patel
(74) *Attorney, Agent, or Firm* — H.C. Park & Associates, PLC

(57) ABSTRACT

A window member includes: a main surface; a first surface adjacent to a first side of the main surface in a first direction; a second surface adjacent to the first surface in the first direction; a third surface adjacent to a second side crossing the first side of the main surface in a second direction crossing the first direction; a fourth surface adjacent to the third surface in the second direction; and a first edge surface adjacent to the first surface and the third surface, wherein the main surface and a flat surface portion of the second surface form a first angle of 60 degrees or more and 120 degrees or less, and wherein the main surface and a flat surface portion of the fourth surface form a second angle of 60 degrees or more and 120 degrees or less.

20 Claims, 11 Drawing Sheets

WINDOW MEMBER AND DISPLAY DEVICE WITH WINDOW MEMBER

CROSS-REFERENCE TO RELATED APPLICATION

This application claims priority from and the benefit of Korean Patent Application No. 10-2019-0055457, filed on May 13, 2019, which is hereby incorporated by reference for all purposes as if fully set forth herein.

BACKGROUND

Field

Exemplary embodiments of the invention relate generally to a window member having improved reliability and a display device provided with the same.

Discussion of the Background

Various display apparatuses used for multimedia devices, such as televisions, mobile phones, navigators, computer monitors, and game terminals, are being developed. These display devices may each have a display panel for providing a user with an image having predetermined information and a window member for protecting the display panel. The window member may be formed of a reinforced glass material or a transparent plastic material.

In order to improve aesthetics, display devices may have edge portions of a display region that are bent with a predetermined curvature. Thus, a window member may cover the edge portions of a display region.

The above information disclosed in this Background section is only for understanding of the background of the inventive concepts, and, therefore, it may contain information that does not constitute prior art.

SUMMARY

Devices constructed according to exemplary embodiments of the invention are capable of providing a window member having improved reliability and a display device provided with the same.

Additional features of the inventive concepts will be set forth in the description which follows, and in part will be apparent from the description, or may be learned by practice of the inventive concepts.

According to one or more exemplary embodiments of the invention, a window member includes: a main surface; a first surface adjacent to a first side of the main surface in a first direction; a second surface adjacent to the first surface in the first direction; a third surface adjacent to a second side crossing the first side of the main surface in a second direction crossing the first direction; a fourth surface adjacent to the third surface in the second direction; and a first edge surface adjacent to the first surface and the third surface, wherein the main surface and a flat surface portion of the second surface form a first angle of 60 degrees or more and 120 degrees or less, and wherein the main surface and a flat surface portion of the fourth surface form a second angle of 60 degrees or more and 120 degrees or less.

The window member may further include: a fifth surface adjacent to the main surface in the first direction opposite to the first surface with respect to the main surface; a sixth surface adjacent to the fifth surface in the first direction; and a second edge surface adjacent to the third surface and the fifth surface.

The window member may further include: a seventh surface adjacent to the main surface in the second direction opposite to the third surface with respect to the main surface; an eighth surface adjacent to the seventh surface in the second direction; a third edge surface adjacent to the first surface and the seventh surface; and a fourth edge surface adjacent to the fifth surface and the seventh surface.

An edge of the first edge surface may have a convex shape in a plan view.

An edge of the first edge surface may have a concave shape in a plan view.

The second surface may be bent with respect to a first bending axis and the third surface may be bent with respect to a second bending axis, wherein the first bending axis may be defined to overlap a boundary between the first surface and the second surface, and the second bending axis may be defined to overlap a boundary between the third surface and the fourth surface.

The main surface, the first surface, the third surface, and the first edge surface may be provided on a same plane.

The first bending axis and the second bending axis may intersect at a position not overlapping the first edge surface in a plan view.

The first surface may be bent with respect to a first bending axis, and the third surface may be bent with respect to a second bending axis, wherein the first bending axis may be defined to overlap a boundary between the main surface and the first surface, and the second bending axis may be defined to overlap a boundary between the main surface and the third surface.

The first bending axis and the second bending axis may intersect at a position overlapping the first edge surface in a plan view.

A length of an arc formed on the first edge may be smaller than or equal to 1 mm.

According to one or more exemplary embodiments of the invention, a display apparatus includes: a display panel; and a window member configured to cover the display panel, the window member including: a main surface; a first surface adjacent to a first side of the main surface in a first direction; a second surface adjacent to the first surface in the first direction; a third surface adjacent to a second side crossing the first side of the main surface in a second direction crossing the first direction; a fourth surface adjacent to the third surface in the second direction; and a first edge surface adjacent to the first surface and the third surface, wherein the main surface and a flat surface portion of the second surface form a first angle of 60 degrees or more and 120 degrees or less, and wherein the main surface and a flat surface portion of the fourth surface form a first angle of 60 degrees or more and 120 degrees or less.

A shape of the display panel may correspond to a shape of the window member.

An edge of the first edge surface may have a convex shape in a plan view.

An edge of the first edge surface may have a concave shape in a plan view.

The display panel may be configured to display an image through the main surface, the first surface, the second surface, the third surface, and the fourth surface.

The second surface may be bent with respect to a first bending axis and the third surface may be bent with respect to a second bending axis, wherein the first bending axis may be defined to overlap a boundary between the first surface and the second surface, and the second bending axis may be defined to overlap a boundary between the third surface and the fourth surface.

The first bending axis and the second bending axis may intersect at a position not overlapping the first edge surface in a plan view.

The first surface may be bent with respect to a first bending axis, and the third surface may be bent with respect to a second bending axis, wherein the first bending axis may be defined to overlap a boundary between the main surface and the first surface, and the second bending axis may be defined to overlap a boundary between the main surface and the third surface.

The first bending axis and the second bending axis may intersect at a position overlapping the first edge surface in a plan view.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
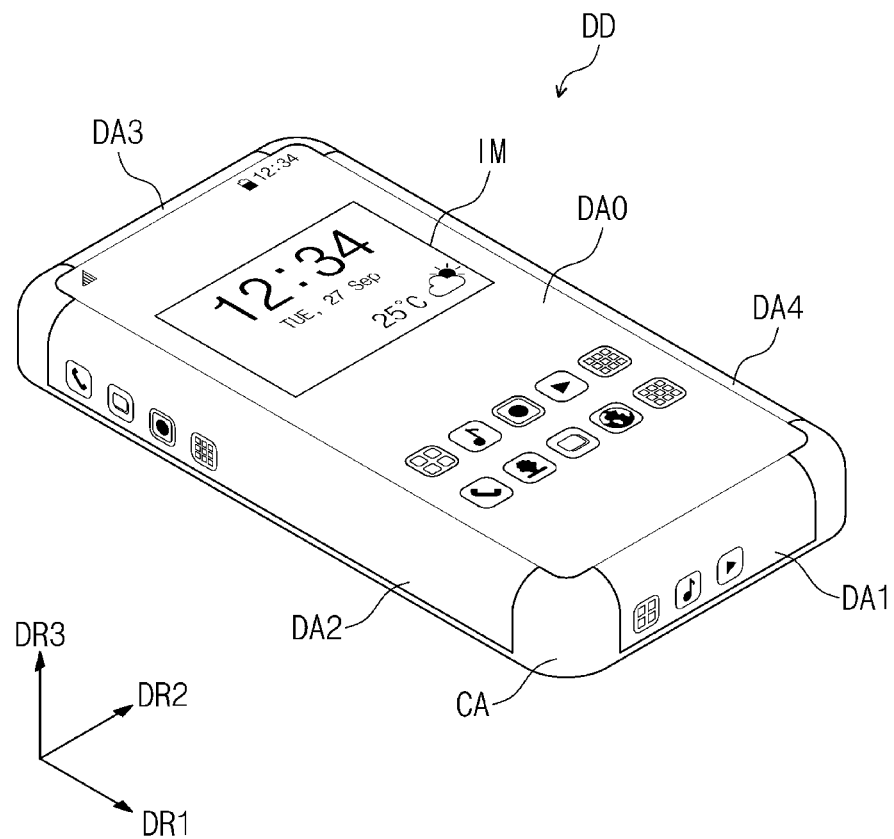
FIG. 1 is a perspective view of a display device according to an exemplary embodiment of the current disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the inventive concepts will be described with reference to the accompanying drawings.

Figure 2:
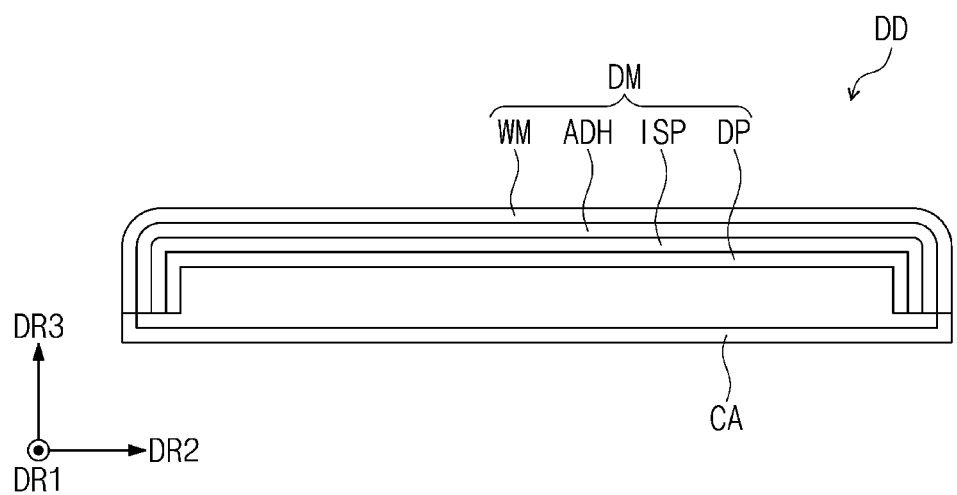
FIG. 2 is a cross-sectional view of a display device according to an exemplary embodiment of the current disclosure.

FIG. 1 is a perspective view of a display device according to an exemplary embodiment of the current disclosure, and FIG. 2 is a cross-sectional view of a display device according to an exemplary embodiment of the current disclosure.

Referring to FIGS. 1 and 2, a display device DD in this exemplary embodiment may include a flexible display device. However, the exemplary embodiment of the current disclosure is not limited thereto, and the display device DD according to an exemplary embodiment of the current disclosure may be a rigid display device DD. A display device DD according to an exemplary embodiment of the current disclosure may be used for a large-sized electronic device such as a television and a monitor, and a small and medium-sized electronic device such as a mobile phone, a tablet, a vehicle navigation device, a game machine, or a smart watch. In this exemplary embodiment, the display device DD is exemplarily illustrated as a smartphone.

The display device DD may include a display module DM and a case member CA.

The display module DM may have a display region defined thereon. The display region may be defined as a region for displaying an image IM. The display region may include a main display region DA0 and first to fourth subsidiary display regions DA1, DA2, DA3, and DA4 adjacent to the main display region DA0.

The main display region DA0 may be parallel to the surface defined by a first direction DR1 and a second direction DR2. The normal direction of the main display region DA0, that is, the thickness direction of the display device DD may be a third direction DR3. The third direction DR3 may be a direction crossing the first and second directions DR1 and DR2. The first direction DR1, the second direction DR2, and the third direction DR3 may be perpendicular to each other.

The main display region DA0 may display an image IM through the front surface thereof. For example, the main display region DA0 may display the image IM toward the third direction DR3. The image IM may include not only moving images but also static images. FIG. 1 illustrates a watch window and application icons as examples of the image IM.

Meanwhile, the directions indicated by the first to third directions DR1, DR2, and DR3 are relative concepts and may be converted into other directions. Hereinafter, the first to third directions are directions, which the first to third directions DR1, DR2, and DR3 respectively indicate, and are referred to by the same reference symbols. In addition, in this specification, the surface defined by the first direction DR1 and the second direction DR2 may be defined as a plane, and "viewed in a plan view" may be defined as viewed in the third direction.

The first subsidiary display region DA1 may be adjacent to one side of the main display region DA0 in the first direction DR1. The first subsidiary display region DA1 may display the image IM in a direction crossing the third direction DR3 of the display device DD. For example, the angle formed by the main display region DA0 and the first subsidiary display region DA1 is about 90 degrees, the direction crossing the thickness direction may be the first direction DR1. The second subsidiary display region DA2 may be adjacent to one side of the main display region DA0 in the second direction DR2. The second subsidiary display region DA2 may display the image IM in a direction crossing the third direction DR3. For example, the angle formed by the main display region DA0 and the second subsidiary display region DA2 is about 90 degrees, the direction crossing the thickness direction may be the second direction DR2. The third subsidiary display region DA3 may be adjacent to one side of the main display region DA0 in the first direction DR1. The third subsidiary display region DA3 may display the image IM in a direction crossing the third direction DR3 of the display device DD. For example, the angle formed by the main display region DA0 and the third subsidiary display region DA3 is about 90 degrees, the direction crossing the thickness direction may be the first direction DR1. The fourth subsidiary display region DA4 may be adjacent to one side of the main display region DA0 in the second direction DR2. The fourth subsidiary display region DA4 may display the image IM in a direction crossing the third direction DR3 of the display device DD. For example, the angle formed by the main display region DA0 and the fourth subsidiary display region DA4 is about 90 degrees, the direction crossing the thickness direction may be the second direction DR2.

The display module DM may include a display panel DP, an input sensing panel ISP, an adhesive member ADH, and a window member WM.

The display panel DP may include a light-emitting type display panel. The light-emitting type display panel may be an organic light-emitting display panel or a quantum dot light-emitting display panel. The light-emitting layer of the organic light-emitting display panel may include an organic light-emitting material. The light-emitting layer of the quantum dot display panel may include quantum dots, quantum rods or the like. This is exemplarily described, and in the exemplary embodiment of the current disclosure, the display panel DP is not particularly limited. In one embodiment of the current disclosure, an organic light-emitting display panel is exemplarily illustrated as the display panel DP.

The input sensing panel ISP may be disposed on the display panel DP. The input sensing panel ISP may directly be disposed on the display panel DP or be coupled to the display panel DP via the adhesive member.

The input sensing panel ISP according to an exemplary embodiment of the current disclosure may sense a change in electrostatic capacity due to an external object and sense an external input. This may be referred to as an electrostatic capacity-type input sensing panel. The input sensing panel ISP according to an exemplary embodiment of the current disclosure may sense a change in pressure due to an external object and sense an external input. This may be referred to as an pressure-sensitive input sensing panel.

The adhesive member ADH may be disposed between the window member WM and the input sensing panel ISP. The adhesive member ADH may couple the window member WM and the input sensing panel ISP. The adhesive member ADH may include a general adhesive or an adhesive agent. For example, the adhesive member ADH may include a pressure sensitive adhesive (PSA), an optical clear adhesive (OCA), or an optical clear resin (OCR). In an exemplary embodiment, the adhesive member ADH may not be provided.

The window member WM may be disposed on the adhesive member ADH. The window member WM may cover the display panel DP. The shape of the display panel DP may correspond to the shape of the window member WM. The window member WM may protect the display panel DP from external shock and provide a user with an input surface. The window member WM may include glass or plastic. The window member WM may have a transparent property so that light generated in the display panel DP may pass therethrough.

A case member CA may be disposed under the display module DM. The case member CA may be adjacent to the display region. The case member CA may have a predetermined color. The case member CA may be disposed on the outermost periphery of the display device DD and accommodate components therein. The case member CA may include a bottom surface and side walls extending from the bottom surface. In addition, electronic modules may be accommodated in an internal space defined by the bottom surface and the side walls. The electronic modules may include, for example, a camera, a flash, a fingerprint sensor, a battery, a functional sensor, etc. The functional sensor may include a proximity sensor, a color concentration detection sensor, a luminosity sensor, a motion sensor, a heartbeat sensor, or the like. However, this is merely an example, and exemplary embodiments of the functional sensor are not limited thereto. In addition, a portion of the camera, flash, fingerprint sensor, battery, and functional sensor may not be provided and other electronic modules may further be disposed.

The case member CA may include a material having a relatively higher rigidity than the display module DM. For example, the case member CA may include glass, plastic, or metal, or include a plurality of frames and/or plates composed of combinations thereof. The case member CA may stably protect the components of the display device DD from external shock.

According to embodiments of the current disclosure, a portion of edges of the window member WM may be omitted. The case member CA may be disposed on the omitted portion of the edges of the window member WM. The case member CA may include a material having a relatively higher rigidity than the window member WM. The case member CA may reduce the probability that the window member WM is damaged by external shock applied to the edges. Accordingly, the window member WM may prevent or reduce generation of a crack due to an external shock applied from the outside. Thus, the window member WM having improved reliability and the display device DD provided with the same may be provided.

Figure 3:
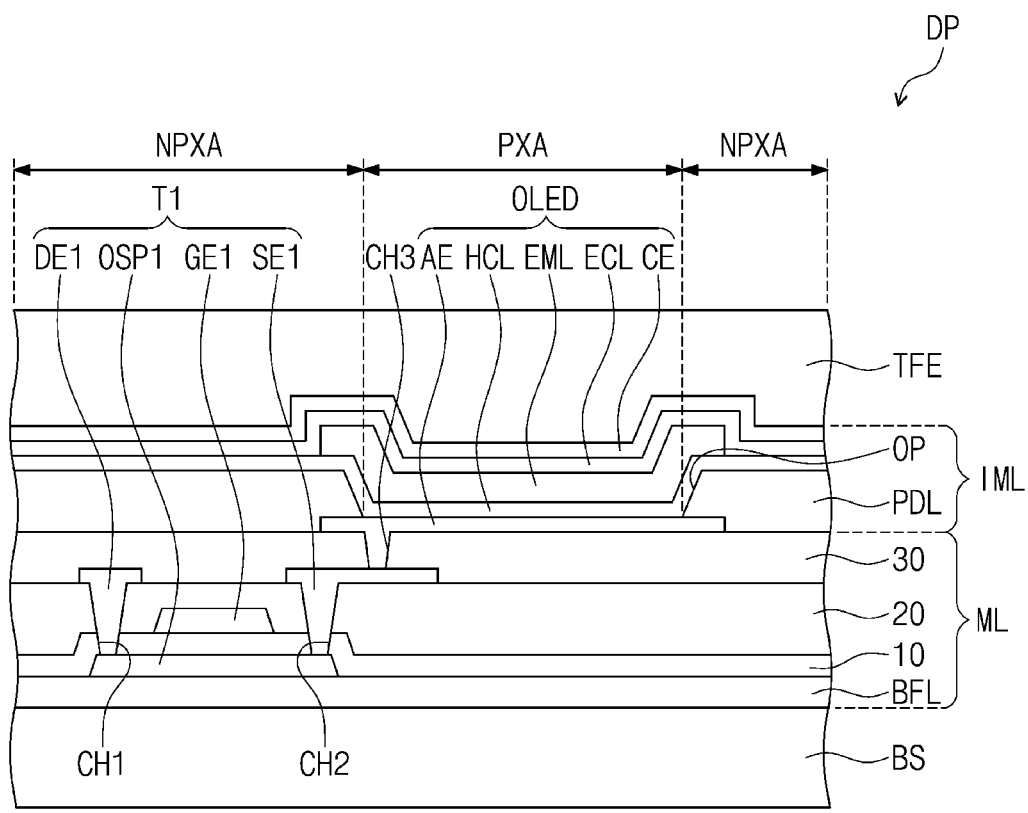
FIG. 3 is a cross-sectional view of a display panel according to an exemplary embodiment of the current disclosure.

FIG. 3 is a cross-sectional view of a display panel according to an exemplary embodiment of the current disclosure.

Referring to FIG. 3, a display panel DP may include a base layer BS, a circuit element layer ML, a display element layer IML, and a thin film encapsulation layer TFE. The circuit element layer ML, the display element layer IML, and the thin film encapsulation layer TFE may be sequentially disposed on the base layer BS.

The base layer BS may include a synthetic resin film layer. A synthetic resin film layer may be formed on a work board used when manufacturing the display panel DP. Then, a conductive layer, an insulating layer, etc, may be formed on the synthetic resin film layer. When the work board is removed, the synthetic resin film layer may correspond to the base layer BS. The synthetic resin film layer may include a thermosetting resin. In particular, the synthetic resin film layer may be a polyimide-based resin layer, and the material thereof is not particularly limited. Besides, the base layer BS may include an organic/inorganic composite material substrate or the like.

In this exemplary embodiment, the circuit element layer ML may include a buffer film BFL, a first intermediate inorganic film 10, and a second intermediate inorganic film 20, which are inorganic films, and an intermediate organic film 30 which is an organic film. The materials for the inorganic film and the organic film are not particularly limited, and in one embodiment of the current disclosure, the buffer film BFL may be selectively disposed/omitted.

A semiconductor pattern OSP1 of a transistor T1 may be disposed on the buffer film BFL. The semiconductor pattern OSP1 may be selected from among amorphous silicon, polysilicon, or metal oxide semiconductors.

The first intermediate inorganic film 10 may be disposed on the semiconductor pattern OSP1. A control electrode GE1 of the transistor T1 may be disposed on the first intermediate inorganic film 10.

The second intermediate inorganic film 20 which covers the control electrode GE1 may be disposed on the first intermediate inorganic film 10. An input electrode DE1 and an output electrode SE1 of the transistor T1 may be disposed on the second intermediate inorganic film 20.

The input electrode DE1 and the output electrode SE1 may respectively connected to the semiconductor pattern OSP1 via a first through-hole CH1 and a second through-is hole CH2 that pass through the first intermediate inorganic film 10 and the second intermediate inorganic film 20. Meanwhile, in another exemplary embodiment of the current disclosure, the transistor T1 may be implemented by being transformed into a bottom gate structure.

The intermediate organic film 30, which covers the input electrode DE1 and the output electrode SE1, may be disposed on the second intermediate inorganic film 20. The intermediate organic film 30 may provide a flat surface.

The display element layer IML may be disposed on the intermediate organic film 30. The display element layer IML may include a pixel defining film PDL and an organic light-emitting diode OLED. The pixel defining film PDL may include an organic material. A first electrode AE may be disposed on the intermediate organic film 30. The first electrode AE may be connected to the output electrode SE1 via a third through-hole CH3 passing through the intermediate organic film 30. An opening OP may be defined in the pixel defining film PDL. The opening OP may expose at least a portion of the first electrode AE. In an exemplary embodiment of the current disclosure, the pixel defining film PDL may not be provided.

In an exemplary embodiment of the current disclosure, a light-emitting region PXA may overlap the transistor T1.

A hole control layer HCL may be disposed in common on the light-emitting region PXA and a non-light-emitting region NPXA. A light-emitting layer EML may be disposed on the hole control layer HCL. The light-emitting layer EML may be disposed on the region corresponding to the opening OP. The light-emitting layer EML may include an organic material and/or an inorganic material. The light-emitting layer EML may generate a predetermined colored color light.

An electron control layer ECL may be disposed on the light-emitting layer EML. A second electrode CE may be disposed on the electron control layer ECL.

The thin film encapsulation layer TFE may be disposed on the second electrode CE. The thin film encapsulation layer TFE may cover the second electrode CE. A capping layer which covers the second electrode CE may further be disposed between the thin film encapsulation layer TFE and the second electrode CE. In this case, the thin film encapsulation layer TFE may directly cover the capping layer.

Figure 4:
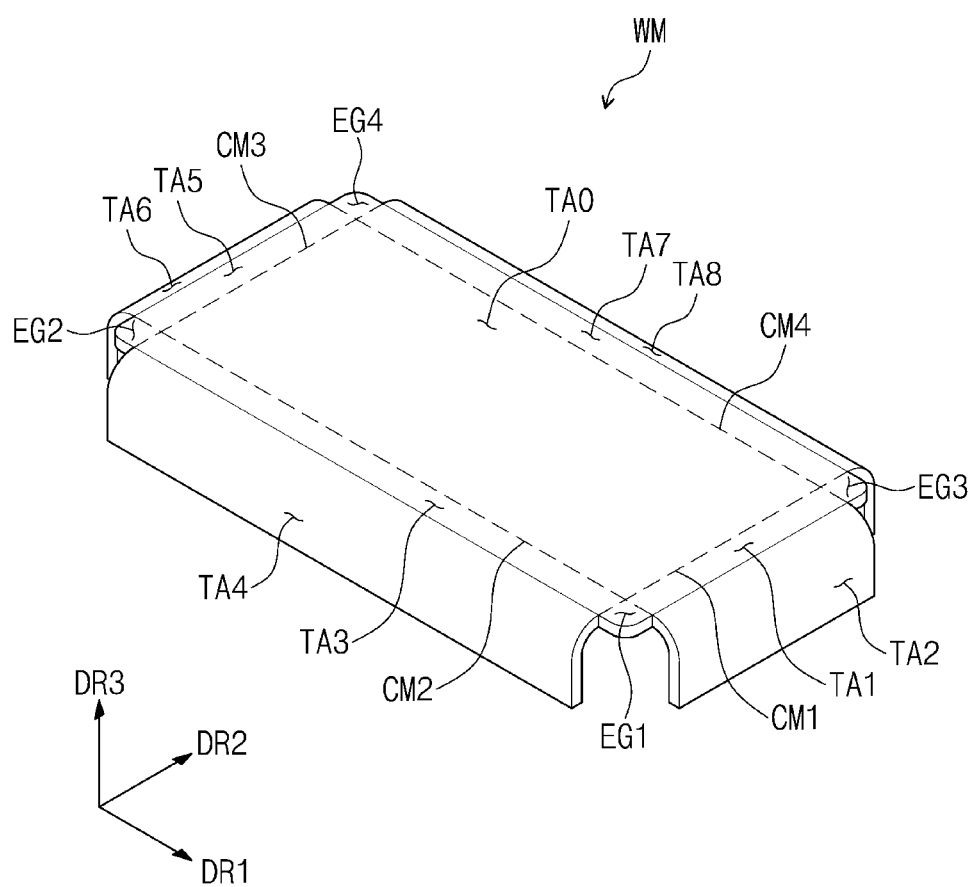
FIG. 4 is a perspective view of a window member according to an exemplary embodiment of the current disclosure.
Figure 5:
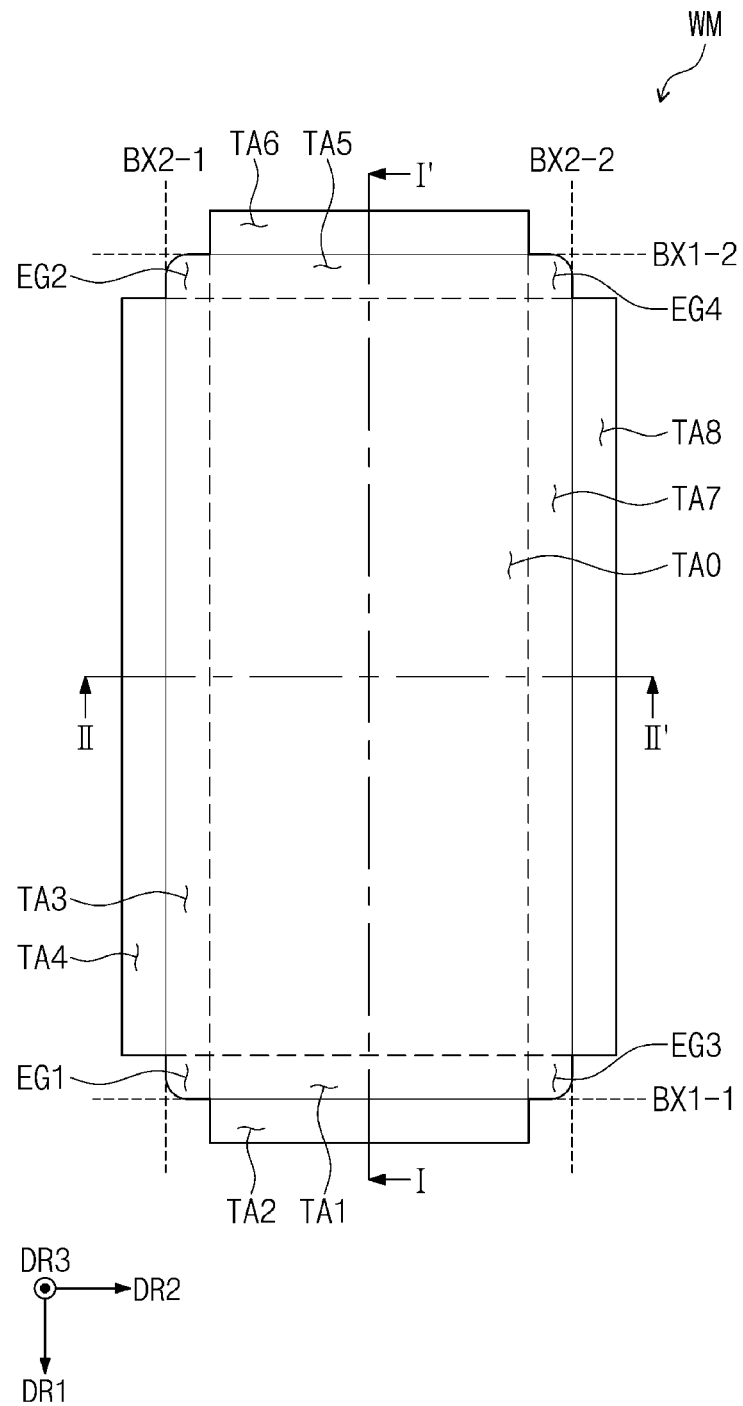
FIG. 5 is a plan view of a window member according to an exemplary embodiment of the current disclosure.

FIG. 4 is a perspective view of a window member according to an exemplary embodiment of the current disclosure and FIG. 5 is a plan view of a window member according to an exemplary embodiment of the current disclosure.

Referring to FIGS. 4 and 5, a window member WM may include a main surface TA0, first to eighth surfaces TA1, TA2, TA3, TA4, TA5, TA6, TA7, and TA8, and first to fourth edge surfaces EG1, EG2, EG3, and EG4. The main surface TA0 may be parallel to the plane defined by the first direction DR1 and the second direction DR2.

The main surface TA0 may include: a first side CM1 extending in a direction parallel to the second direction DR2; a second side CM2 crossing the first side CM1 and extending in a direction parallel to the first direction DR1; a third side CM3 crossing the second side CM2 and extending in a direction parallel to the second direction DR2; and a fourth side CM4 crossing the third side CM3 and extending in a direction parallel to the first direction DR1. The first side CM1 may be parallel to the third side CM3. The second side CM2 may be parallel to the fourth side CM4.

The first surface TA1 may be adjacent to the first side CM1 in the first direction DR1. The second surface TA2 may be adjacent to the first surface TA1 in the first direction DR1. The third surface TA3 may be adjacent to the second side CM2 in the second direction DR2. The fourth surface TA4 may be adjacent to the third surface TA3 in the second direction DR2. The fifth surface TA5 may be adjacent to the third side CM3 in the first direction DR1. The fifth surface TA5 may be spaced apart from the first surface TA1 in the first direction DR1 with the main surface TA0 therebetween. The sixth surface TA6 may be adjacent to the fifth surface TA5 in the first direction DR1. The seventh surface TA7 may be adjacent to the fourth side CM4 in the second direction DR2. The seventh surface TA7 may be spaced apart from the third surface TA3 in the second direction DR2 with the main surface TA0 therebetween. The eighth surface TA8 may be adjacent to the seventh surface TA7 in the second direction DR2.

The first edge surface EG1 may be a surface adjacent to the first surface TA1 and the third surface TA3. The first edge surface EG1 may be disposed between the first surface TA1 and the third surface TA3. The edge of the first edge surface EG1 may have a convex shape when viewed in a plan view. The second edge surface EG2 may be a surface adjacent to the third surface TA3 and the fifth surface TA5. The second edge surface EG2 may be disposed between the third surface TA3 and the fifth surface TA5. The edge of the second edge surface EG2 may have a convex shape when viewed in a plan view. The third edge surface EG3 may be a surface adjacent to the first surface TA1 and the seventh surface TA7. The third edge surface EG3 may be disposed between the first surface TA1 and the seventh surface TA7. The edge of the third edge surface EG3 may have a convex shape when viewed in a plan view. The fourth edge surface EG4 may be a surface adjacent to the fifth surface TA5 and the seventh surface TA7. The fourth edge surface EG4 may be disposed between the fifth surface TA5 and the seventh surface TA7. The edge of the fourth edge surface EG4 may have a convex shape when viewed in a plan view.

The main surface TA0, the first surface TA1, the third surface TA3, the fifth surface TA5, and the seventh surface TA7 may be provided on the same plane.

A first bending axis BX1-1 may overlap the boundary between the first surface TA1 and the second surface TA2 when viewed in a plan view. The first bending axis BX1-1 may extend in the second direction DR2. A second bending axis BX2-1 may overlap the boundary between the third surface TA3 and the fourth surface TA4 when viewed in a plan view. The second bending axis BX2-1 may extend in the first direction DR1. A third bending axis BX1-2 may overlap the boundary between the fifth surface TA5 and the sixth surface TA6 when viewed in a plan view. The third bending axis BX1-2 may extend in the second direction DR2. A fourth bending axis BX2-2 may overlap the boundary between the seventh surface TA7 and the eighth surface TA8 when viewed in a plan view. The fourth bending axis BX2-2 may extend in the first direction DR1.

When viewed in a plan view, the first edge surface EG1 may not overlap the position at which the first bending axis BX1-1 and the second bending axis BX2-1 intersect. When viewed in a plan view, the second edge surface EG2 may not overlap the position at which the third bending axis BX1-2 and the second bending axis BX2-1 intersect. When viewed in a plan view, the third edge surface EG3 may not overlap the position at which the first bending axis BX1-1 and the fourth bending axis BX2-2 intersect. When viewed in a plan view, the fourth edge surface EG4 may not overlap the position at which the third bending axis BX1-2 and the fourth bending axis BX2-2 intersect.

The display panel DP (see FIG. 2) may display an image IM (see FIG. 1) through the main surface TA0, first to eighth surfaces TA1, TA2, TA3, TA4, TA5, TA6, TA7, and TA8, and first to fourth edge surfaces EG1, EG2, EG3, and EG4.

According to an exemplary embodiment of the current disclosure, the second surface TA2 may be bent from the first surface TA1. The fourth surface TA4 may be bent from the third surface TA3. The sixth surface TA6 may be bent from the fifth surface TA5. The eighth surface TA8 may be bent from the seventh surface TA7. The bent second surface TA2 and the bent fourth surface TA4 may be spaced apart from each other. A portion of the window member WM between the second surface TA2 and the fourth surface TA4 may be omitted. The bent fourth surface TA4 and the bent sixth surface TA6 may be spaced apart from each other. A portion of the window member WM between the fourth surface TA4 and the sixth surface TA6 may be omitted. The bent sixth surface TA6 and the bent eighth surface TA8 may be spaced apart from each other. A portion of the window member WM between the sixth surface TA6 and the eighth surface TA8 may be omitted. The portions may correspond to the edges of the window member WM. Even when an external shock is applied to the edges, the probability that the external shock is transmitted to the window member WM may be reduced. The probability that the window member WM is damaged by the external shock applied to the edges may be reduced. Accordingly, the window member WM may prevent or reduce generation of a crack due to an external shock applied from the outside. Thus, the window member WM having improved reliability and the display device DD (see FIG. 1) provided with the same may be provided.

Figure 6:
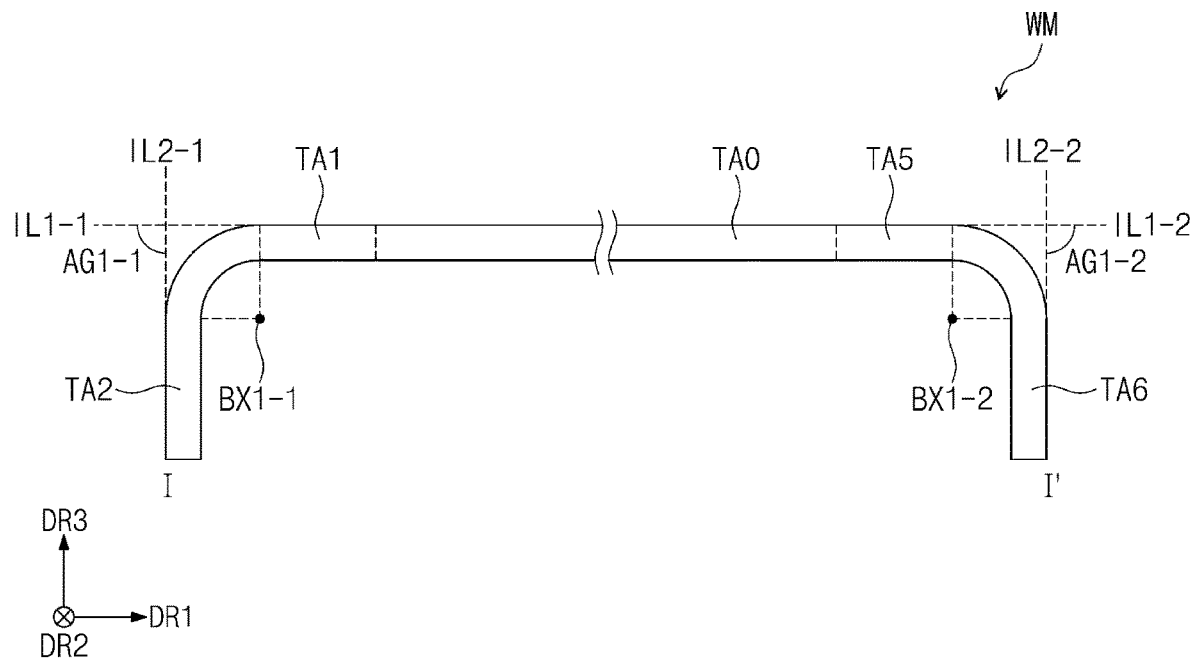
FIG. 6 is a cross-sectional view taken along a sectional line I-I' shown in FIG. 5.

FIG. 6 is a cross-sectional view taken along a sectional line I-I' shown in FIG. 5.

Referring to FIG. 6, the main surface TA0 and the first surface TA1 may form a first angle AG1-1 with respect to the second surface TA2. Particularly, the main surface TA0 and a flat part of the second surface TA2 form the first angle AG1-1. The first angle AG1-1 may be an angle formed by a virtual first line IL1-1, which extends in the first direction DR1 on the main surface TA0, and a virtual second line IL2-1, which extends in a direction crossing the first direction DR1 along a slope of an end portion of the second surface TA2 at the end portion of the second surface TA2. The first angle AG1-1 may be approximately 60 degrees or more and 120 degrees or less. For example, when the first angle AG1-1 is approximately 90 degrees, the direction crossing the first direction DR1 may be parallel to the third direction DR3.

The second surface TA2 may be bent from the first surface TA1 with respect to the first bending axis BX1-1. The second surface TA2 may be bent and have a curvature.

The main surface TA0 and the fifth surface TA5 may form a predetermined second angle AG1-2 with respect to the sixth surface TA6. Particularly, the main surface TA0 and a flat part of the sixth surface TA6 form the second angle AG1-2. The second angle AG1-2 may be an angle formed by a virtual third line IL1-2, which extends in the first direction DR1 on the main surface TA0, and a virtual fourth line IL2-2, which extends in a direction crossing the first direction DR1 along a slope of an end portion of the sixth surface TA6 at the end portion of the sixth surface TA6. The second angle AG1-2 may be approximately 60 degrees or more and 120 degrees or less. For example, when the second angle AG1-2 is approximately 90 degrees, the direction crossing the first direction DR1 may be parallel to the third direction DR3.

The sixth surface TA6 may be bent from the fifth surface TA5 with respect to the third bending axis BX1-2. The sixth surface TA6 may be bent and have a curvature.

Figure 7:
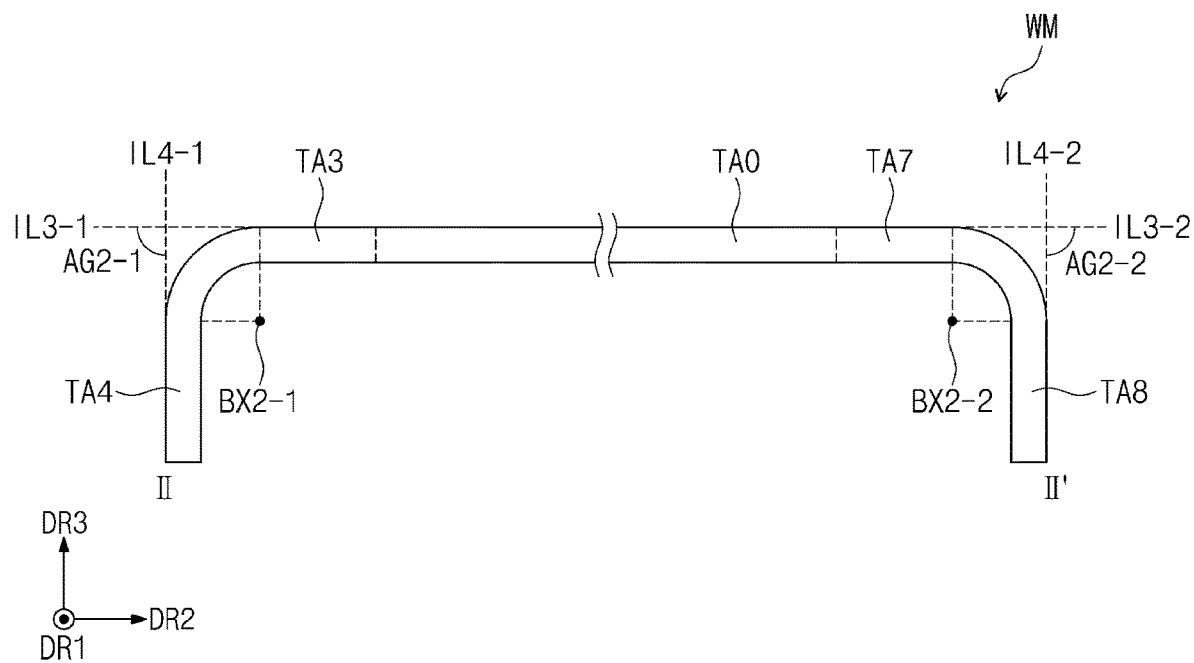
FIG. 7 is a cross-sectional view taken along a sectional line II-II' shown in FIG. 5.

FIG. 7 is a cross-sectional view taken along a sectional line II-II' shown in FIG. 5.

Referring to FIG. 7, the main surface TA0 and the third surface TA3 may form a predetermined third angle AG2-1 with respect to the fourth surface TA4. Particularly, the main surface TA0 and a flat part of the fourth surface TA4 form the third angle AG2-1. The third angle AG2-1 may be an angle formed by a virtual first line IL3-1, which extends in the second direction DR2 on the main surface TA0, and a virtual second line IL4-1, which extends in a direction crossing the second direction DR2 along a slope of an end portion of the fourth surface TA4 at the end portion of the fourth surface TA4. The third angle AG2-1 may be approximately 60 degrees or more and 120 degrees or less. For example, when the third angle AG2-1 is approximately 90 degrees, the direction crossing the second direction DR2 may be parallel to the third direction DR3.

The fourth surface TA4 may be bent from the third surface TA3 with respect to the second bending axis BX2-1. The fourth surface TA4 may be bent and have a curvature.

The main surface TA0 and the seventh surface TA7 may form a predetermined fourth angle AG2-2 with respect to the eighth surface TA8. Particularly, the main surface TA0 and a flat part of the eighth surface TA8 form the fourth angle AG2-2. The fourth angle AG2-2 may be an angle formed by a virtual third line IL3-2, which extends in the second direction DR2 on the main surface TA0, and a virtual fourth line IL4-2, which extends in a direction crossing the second direction DR2 along a slope of an end portion of the eighth surface TA8 at the end portion of the eighth surface TA8. The fourth angle AG2-2 may be approximately 60 degrees or more and 120 degrees or less. For example, when the fourth angle AG2-2 is approximately 90 degrees, the direction crossing the second direction DR2 may be parallel to the third direction DR3.

The eighth surface TA8 may be bent from the seventh surface TA7 with respect to the second bending axis BX2-2. The eighth surface TA8 may be bent and have a curvature.

Figure 8:
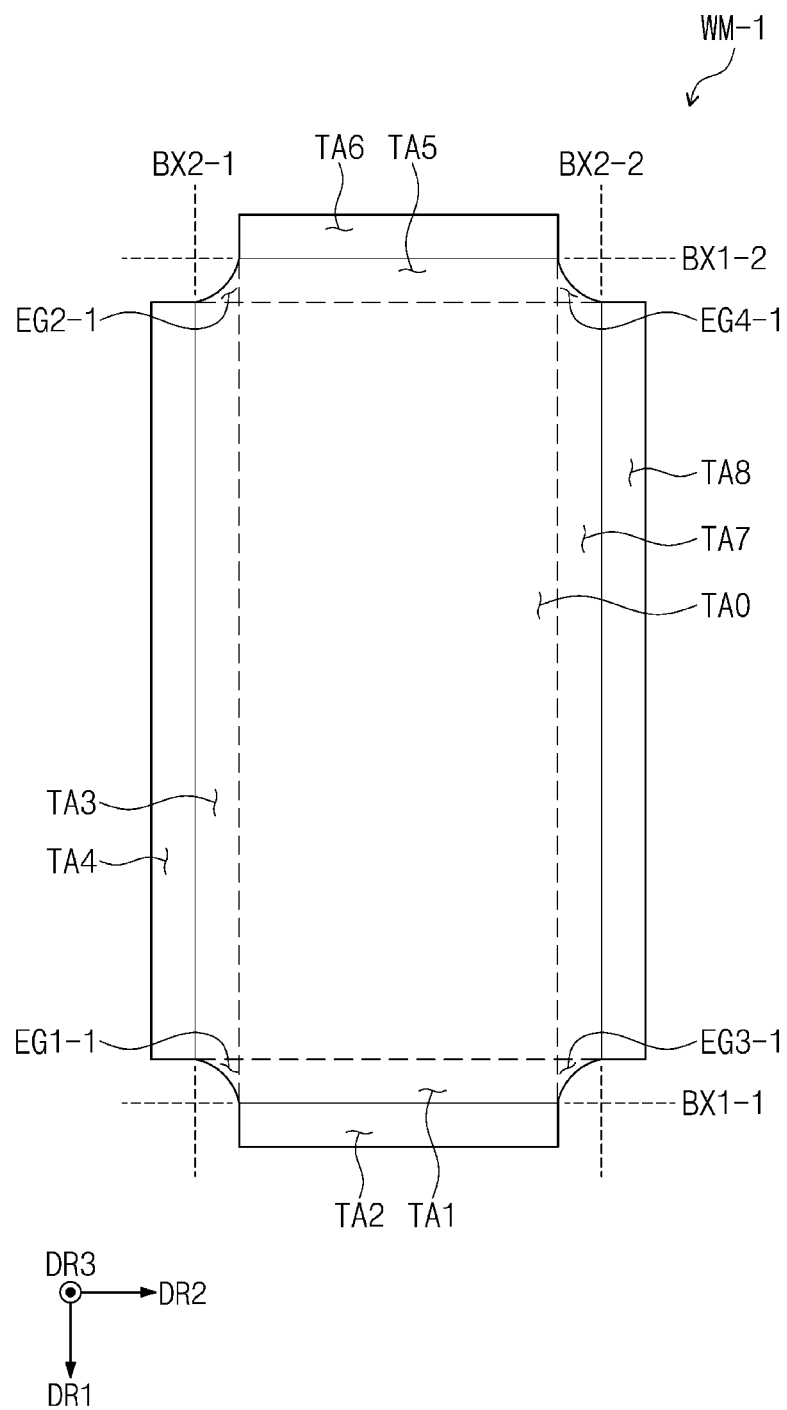
FIG. 8 is a plan view of a window member according to an exemplary embodiment of the current disclosure.

FIG. 8 is a plan view of a window member according to an exemplary embodiment of the current disclosure. The same reference symbols are applied to the components described through FIG. 5, and the description on the components will be omitted.

Referring to FIGS. 5 and 8, the first edge surface EG1-1 may be a surface adjacent to the first surface TA1 and the third surface TA3. The first edge surface EG1-1 may be disposed between the first surface TA1 and the third surface TA3. The edge of the first edge surface EG1 may have a concave shape when viewed in a plan view. The second edge surface EG2-1 may be a surface adjacent to the third surface TA3 and the fifth surface TA5. The second edge surface EG2-1 may be disposed between the third surface TA3 and the fifth surface TA5. The edge of the second edge surface EG2-1 may have a concave shape when viewed in a plan view. The third edge surface EG3-1 may be a surface adjacent to the first surface TA1 and the seventh surface TA7. The third edge surface EG3-1 may be disposed between the first surface TA1 and the seventh surface TA7. The edge of the third edge surface EG3-1 may have a concave shape when viewed in a plan view. The fourth edge surface EG4-1 may be a surface adjacent to the fifth surface TA5 and the seventh surface TA7. The fourth edge surface EG4-1 may be disposed between the fifth surface TA5 and the seventh surface TA7. The edge of the fourth edge surface EG4-1 may have a concave shape when viewed in a plan view.

According to an exemplary embodiment of the current disclosure, an edge of a corner of a window member WM-1 of a display device DD (see FIG. 1) may have a concave shape. A case member CA (see FIG. 1) may be disposed on an edge of the display device DD (see FIG. 1). The case member CA (see FIG. 1) may include a material having a relatively higher rigidity than the window member WM-1. Accordingly, even when an external shock is applied to the edge of the display device DD (see FIG. 1), the probability that the external shock is transmitted to the window member WM-1 may be reduced. The probability that the window member WM-1 is damaged by the external shock applied to the edge may be reduced. Accordingly, the window member WM-1 may prevent or reduce generation of a crack due to an external shock applied from the outside. Thus, the window member WM-1 having improved reliability and the display device DD (see FIG. 1) provided with the same may be provided.

Figure 9:
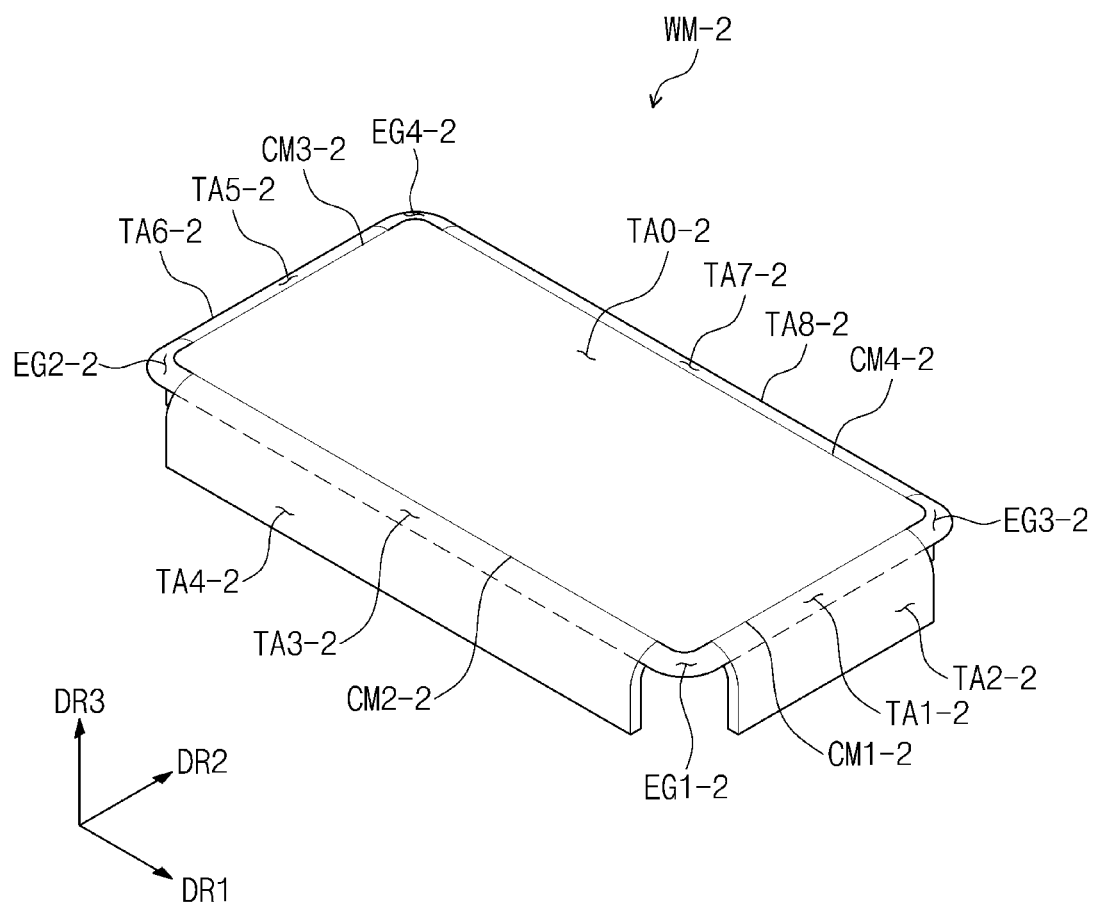
FIG. 9 is a perspective view of a window member according to an exemplary embodiment of the current disclosure.
Figure 10:
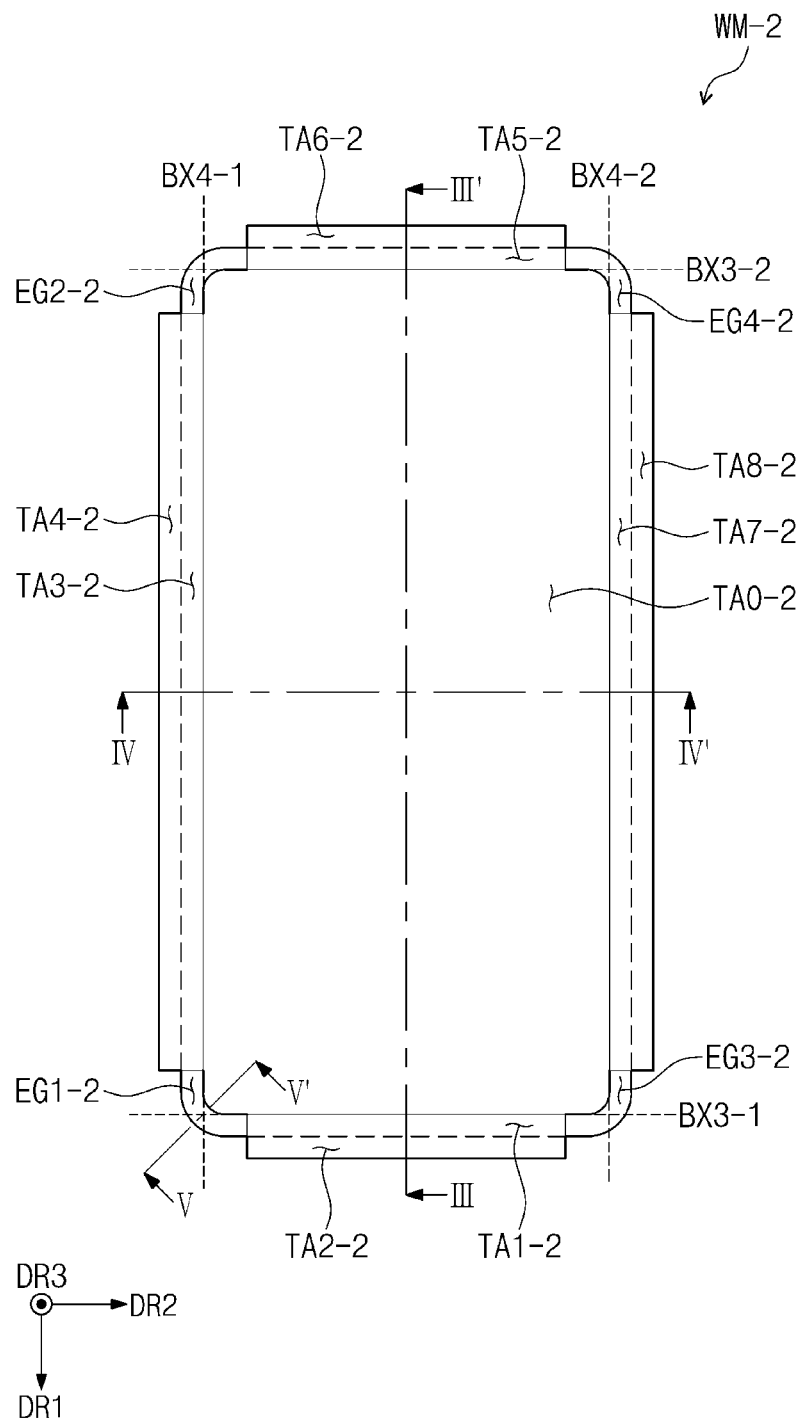
FIG. 10 is a plan view of a window member according to an exemplary embodiment of the current disclosure.

FIG. 9 is a perspective view of a window member according to an exemplary embodiment of the current disclosure and FIG. 10 is a plan view of a window member according to an exemplary embodiment of the current disclosure.

Referring to FIGS. 9 and 10, a window member WM-2 may include a main surface TA0-2, first to eighth surfaces TA1-2, TA2-2, TA3-2, TA4-2, TA5-2, TA6-2, TA7-2, and TA8-2, and first to fourth edge surfaces EG1-2, EG2-2, EG3-2, and EG4-2.

The main surface TA0-2 may be parallel to the plane defined by the first direction DR1 and the second direction DR2. The main surface TA0-2 may include: a first side CM1-2 extending in a direction parallel to the second direction DR2; a second side CM2-2 crossing the first side CM1-2 and extending in a direction parallel to the first direction DR1; a third side CM3-2 crossing the second side CM2-2 and extending in a direction parallel to the second direction DR2; and a fourth side CM4-2 crossing the third side CM3-2 and extending in a direction parallel to the first direction DR1. The first side CM1-2 may be parallel to the third side CM3-2. The second side CM2-2 may be parallel to the fourth side CM4-2.

The first surface TA1-2 may be adjacent to the first side CM1-2 of the main surface TA0-2 in the first direction DR1. The second surface TA2-2 may be adjacent to the first surface TA1-2 in the first direction DR1. The third surface TA3-2 may be adjacent to the second side CM2-2 in the second direction DR2. The fourth surface TA4-2 may be adjacent to the third surface TA3-2 in the second direction DR2. The fifth surface TA5-2 may be adjacent to the third side CM3-2 in the first direction DR1. The fifth surface TA5-2 may be spaced apart from the first surface TA1-2 in the first direction DR1 with the main surface TA0-2 therebetween. The sixth surface TA6-2 may be adjacent to the fifth surface TA5-2 in the first direction DR1. The seventh surface TA7-2 may be adjacent to the fourth side CM4-2 in the second direction DR2. The seventh surface TA7-2 may be spaced apart from the third surface TA3-2 in the second direction DR2 with the main surface TA0-2 therebetween. The eighth surface TA8-2 may be adjacent to the seventh surface TA7-2 in the second direction DR2.

The first edge surface EG1-2 may be a surface adjacent to the first surface TA1-2 and the third surface TA3-2. The first edge surface EG1-2 may be disposed between the first surface TA1-2 and the third surface TA3-2. The edge of the first edge surface EG1-2 may have a convex shape when viewed in a plan view. The second edge surface EG2-2 may be a surface adjacent to the third surface TA3-2 and the fifth surface TA5-2. The second edge surface EG2-2 may be disposed between the third surface TA3-2 and the fifth surface TA5-2. The edge of the second edge surface EG2-2 may have a convex shape when viewed in a plan view. The third edge surface EG3-2 may be a surface adjacent to the first surface TA1-2 and the seventh surface TA7-2. The third edge surface EG3-2 may be disposed between the first surface TA1-2 and the seventh surface TA7-2. The edge of the third edge surface EG3-2 may have a convex shape when viewed in a plan view. The fourth edge surface EG4-2 may be a surface adjacent to the fifth surface TA5-2 and the seventh surface TA7-2. The fourth edge surface EG4-2 may be disposed between the fifth surface TA5-2 and the seventh surface TA7-2. The edge of the fourth edge surface EG4-4 may have a convex shape when viewed in a plan view.

A first bending axis BX3-1 may overlap the boundary between the main surface TA0-2 and the first surface TA1-2 when viewed in a plan view. The first bending axis BX3-1 may extend in the second direction DR2. A second bending axis BX4-1 may overlap the boundary between the main surface TA0-2 and the third surface TA3-2 when viewed in a plan view. The second bending axis BX4-1 may extend in the first direction DR1. A third bending axis BX3-2 may overlap the boundary between the main surface TA0-2 and the fifth surface TA5-2 when viewed in a plan view. The third bending axis BX3-2 may extend in the second direction DR2. A fourth bending axis BX4-2 may overlap the boundary between the main surface TA0-2 and the seventh surface TA7-2 when viewed in a plan view. The fourth bending axis BX4-2 may extend in the first direction DR1.

When viewed in a plan view, the first edge surface EG1-2 may overlap the position at which the first bending axis BX3-1 and the second bending axis BX4-1 intersect. When viewed in a plan view, the second edge surface EG2-2 may overlap the position at which the second bending axis BX4-1 and the third bending axis BX3-2 intersect. When viewed in a plan view, the third edge surface EG3-2 may overlap the position at which the first bending axis BX3-1 and the fourth bending axis BX4-2 intersect. When viewed in a plan view, the fourth edge surface EG4-2 may overlap the position at which the third bending axis BX3-2 and the fourth bending axis BX4-2 intersect.

A display panel DP (see FIG. 2) may display an image IM (see FIG. 1) through the main surface TA0-2, the first to eighth surfaces TA1-2, TA2-2, TA3-2, TA4-2, TA5-2, TA6-2, TA7-2, and TA8-2, and the first to fourth edge surfaces EG1-2, EG2-2, EG3-2, and EG4-2.

According to an exemplary embodiment of the current disclosure, the first surface TA1-2 and the second surface TA2-2 may be bent from the main surface TA0-2. The third surface TA3-2 and the fourth surface TA4-2 may be bent from the main surface TA0-2. The fifth surface TA5-2 and the sixth surface TA6-2 may be bent from the main surface TA0-2. The seventh surface TA7-2 and the eighth surface TA8-2 may be bent from the main surface TA0-2. The bent second surface TA2-2 and the bent fourth surface TA4-2 may be spaced apart from each other. A portion of the window member WM-2 between the second surface TA2-2 and the fourth surface TA4-2 may be omitted. The bent fourth surface TA4-2 and the bent sixth surface TA6-2 may be spaced apart from each other. A portion of the window member WM-2 between the fourth surface TA4-2 and the sixth surface TA6-2 may be omitted. The bent sixth surface TA6-2 and the bent eighth surface TA8-2 may be spaced apart from each other. A portion of the window member WM-2 between the sixth surface TA6-2 and the eighth surface TA8-2 may be omitted. The portions and the first to fourth edge surfaces EG1-2, EG2-2, EG3-2, and EG4-2 may correspond to the edges of the window member WM-2. Even when an external shock is applied to the edges, the probability that the external shock is transmitted to the window member WM-2 may be reduced. The probability that the window member WM-2 is damaged by the external shock applied to the edges may be reduced. Accordingly, the window member WM-2 may prevent or reduce generation of a crack due to an external shock applied from the outside. Thus, the window member WM-2 having improved reliability and the display device DD (see FIG. 1) provided with the same may be provided.

Figure 11:
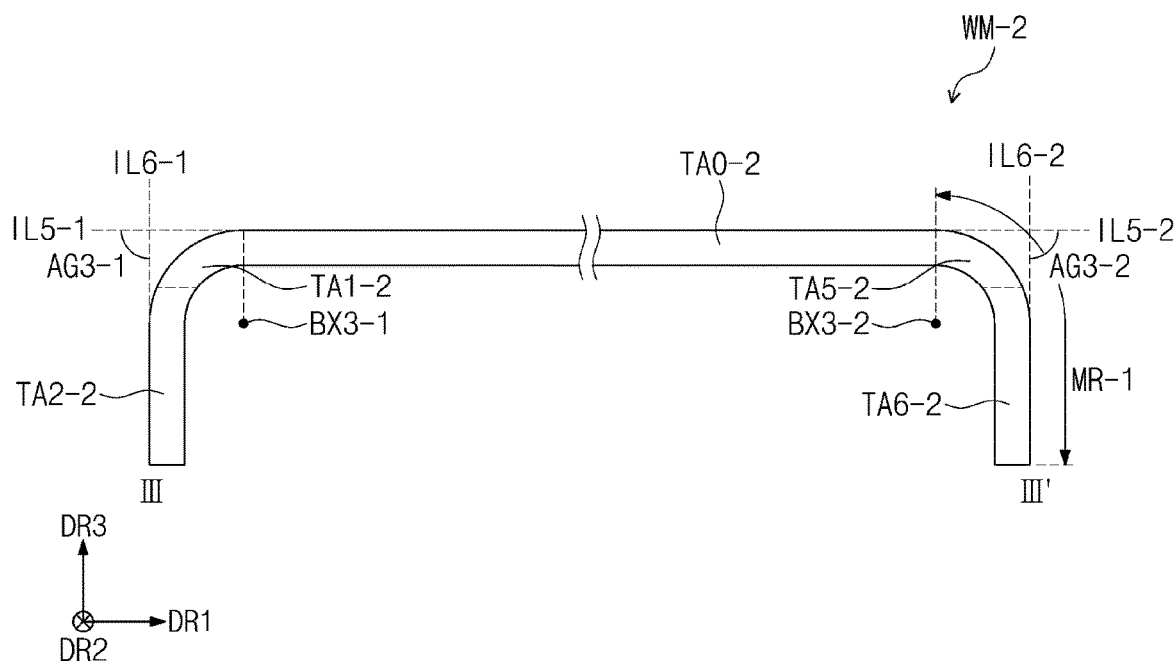
FIG. 11 is a cross-sectional view taken along a sectional line III-III' shown in FIG. 10.

FIG. 11 is a cross-sectional view taken along a sectional line shown in FIG. 10.

Referring to FIG. 11, the main surface TA0-2 may have a predetermined first angle AG3-1 with respect to the first surface TA1-2 and the second surface TA2-2. The first angle AG3-1 may be an angle formed by a virtual first line IL5-1, which extends in the first direction DR1 on the main surface TA0-2, and a virtual second line IL6-1, which extends in a direction crossing the first direction DR1 along a slope of an end portion of the second surface TA2-2 at the end portion of the second surface TA2-2. The first angle AG3-1 may be approximately 60 degrees or more and 120 degrees or less. For example, when the first angle AG3-1 is approximately 90 degrees, the direction crossing the first direction DR1 may be parallel to the third direction DR3.

The first surface TA1-2 and the second surface TA2-2 may be bent from the main surface TA0-2 with respect to the first bending axis BX3-1. The first surface TA1-2 and the second surface TA2-2 may be bent and have a curvature.

The main surface TA0-2 may have a predetermined second angle AG3-2 with respect to the fifth surface TA5-2 and the sixth surface TA6-2. The second angle AG3-2 may be an angle formed by a virtual third line IL5-2, which extends in the first direction DR1 on the main surface TA0-2, and a virtual fourth line IL6-2, which extends in a direction crossing the first direction DR1 along a slope of an end portion of the sixth surface TA6-2 at the end portion of the sixth surface TA6-2. The second angle AG3-2 may be approximately 60 degrees or more and 120 degrees or less. For example, when the second angle AG3-2 is approximately 90 degrees, the direction crossing the first direction DR1 may be parallel to the third direction DR3.

The fifth surface TA5-2 and the sixth surface TA6-2 may be bent from the main surface TA0-2 with respect to the third bending axis BX3-2. The fifth surface TA5-2 and the sixth surface TA6-2 may be bent and have a curvature.

Figure 12:
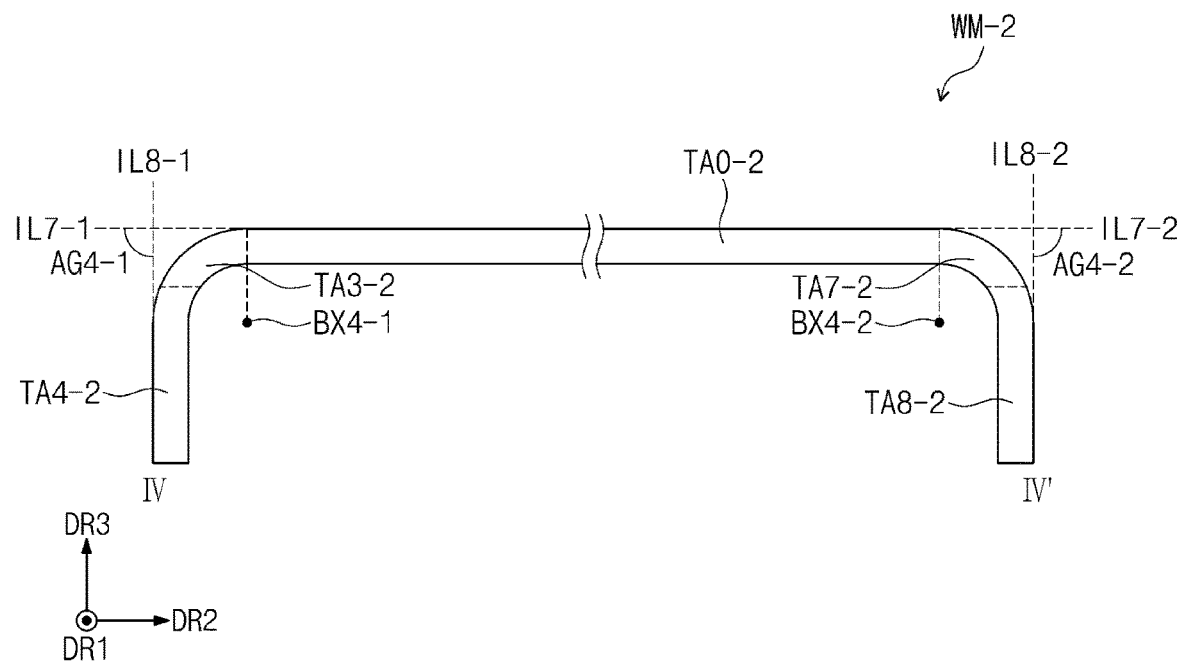
FIG. 12 is a cross-sectional view taken along a sectional line IV-IV' shown in FIG. 10.

FIG. 12 is a cross-sectional view taken along a sectional line IV-IV' shown in FIG. 10.

Referring to FIG. 12, the main surface TA0-2 may have a predetermined third angle AG4-1 with respect to the third surface TA3-2 and the fourth surface TA4-2. The third angle AG4-1 may be an angle formed by a virtual first line IL7-1, which extends in the second direction DR2 on the main surface TA0-2, and a virtual second line IL8-1, which extends in a direction crossing the second direction DR2 along a slope of an end portion of the fourth surface TA4-2 at the end portion of the fourth surface TA4-2. The third angle AG4-1 may be approximately 60 degrees or more and 120 degrees or less. For example, when the third angle AG4-1 is approximately 90 degrees, the direction crossing the second direction DR2 may be parallel to the third direction DR3.

The third surface TA3-2 and the fourth surface TA4-2 may be bent from the main surface TA0-2 with respect to the second bending axis BX4-1. The third surface TA3-2 and the fourth surface TA4-2 may be bent and have a curvature.

The main surface TA0-2 may have a predetermined fourth angle AG4-2 with respect to the seventh surface TA7-2 and the eighth surface TA8-2. The fourth angle AG4-2 may be an angle formed by a virtual third line IL7-2, which extends in the second direction DR2 on the main surface TA0-2, and a virtual fourth line IL8-2, which extends in a direction crossing the second direction DR2 along a slope of an end portion of the eighth surface TA8-2 at the end portion of the eighth surface TA8-2. The fourth angle AG4-2 may be approximately 60 degrees or more and 120 degrees or less. For example, when the fourth angle AG4-2 is approximately 90 degrees, the direction crossing the second direction DR2 may be parallel to the third direction DR3.

The seventh surface TA7-2 and the eighth surface TA8-2 may be bent from the main surface TA0-2 with respect to the fourth bending axis BX4-2. The seventh surface TA7-2 and the eighth surface TA8-2 may be bent and have a curvature.

Figure 13:
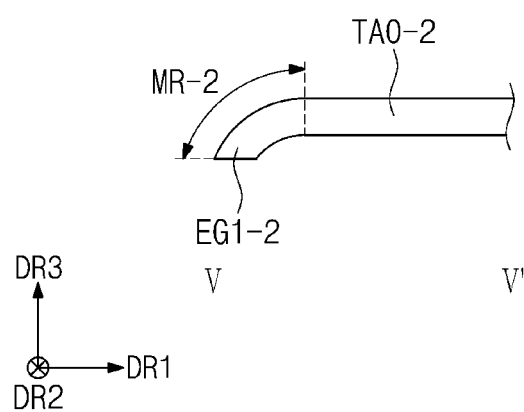
FIG. 13 is a cross-sectional view taken along a sectional line V-V' shown in FIG. 10.

FIG. 13 is a cross-sectional view taken along a sectional line V-V' shown in FIG. 10.

Referring to FIGS. 11 and 13, the first edge surface EG1-2 may be bent and have a curvature. However this is exemplarily described, and the first edge surface EG1-1 may be each of the second to fourth edge surfaces EG2-2, EG3-2, and EG4-2.

A first length MR-1 may be the lengths of the fifth surface TA5-2 and the sixth surface TA6-2 on a cross-sectional surface. However, this is exemplarily described, and the first length MR-1 may be the lengths of the first surface TA1-2 and the second surface TA2-2, the lengths of the third surface TA3-2 and the fourth surface TA4-2, and the lengths of the seventh surface TA7-2 and the eighth surface TA8-2. The second length MR-2 may be the length of an arc of the first edge surface EG1-2 on a cross-sectional surface. However this is exemplarily illustrated, and the second length MR-2 may be the lengths of the arcs of the second to fourth edge surfaces EG2-2, EG3-2, and EG4-2. The second length MR-2 may be smaller than or equal to approximately 1 mm.

The first length MR-1 may be larger than the second length MR-2.

Figure 14:
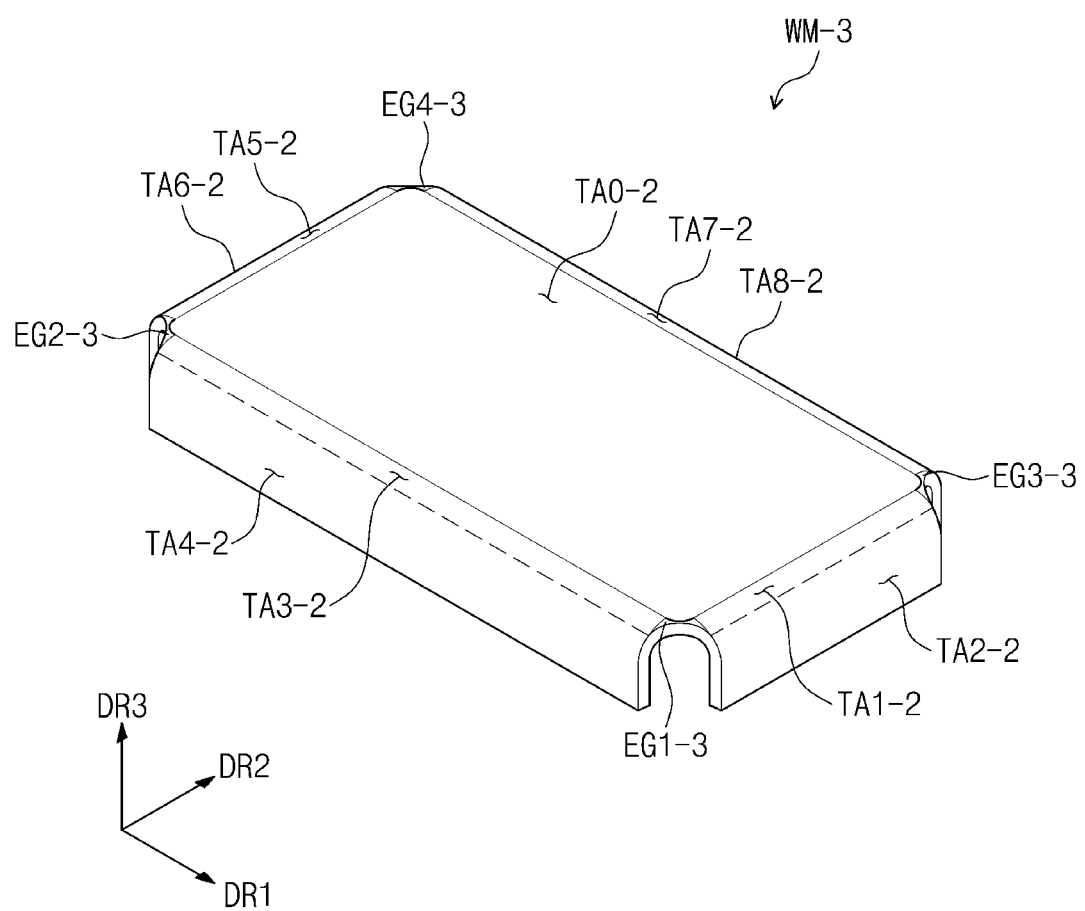
FIG. 14 is a perspective view of a window member according to an exemplary embodiment of the current disclosure.

FIG. 14 is a perspective view of a window member according to an exemplary embodiment of the current disclosure. The same reference symbols are applied to the components described through FIG. 9, and the description on the components will be omitted.

Referring to FIGS. 9 and 14, the first edge surface EG1-3 may be a surface adjacent to the first surface TA1-2 and the third surface TA3-2. The first edge surface EG1-3 may be disposed between the first surface TA1-2 and the third surface TA3-2. The edge of the first edge surface EG1-3 may have a concave shape when viewed in a plan view. The second edge surface EG2-3 may be a surface adjacent to the third surface TA3-2 and the fifth surface TA5-2. The second edge surface EG2-3 may be disposed between the third surface TA3-2 and the fifth surface TA5-2. The edge of the second edge surface EG2-3 may have a concave shape when viewed in a plan view. The third edge surface EG3-3 may be a surface adjacent to the first surface TA1-2 and the seventh surface TA7-2. The third edge surface EG3-3 may be disposed between the first surface TA1-2 and the seventh surface TA7-2. The edge of the third edge surface EG3-3 may have a concave shape when viewed in a plan view. The fourth edge surface EG4-3 may be a surface adjacent to the fifth surface TA5-2 and the seventh surface TA7-2. The fourth edge surface EG4-3 may be disposed between the fifth surface TA5-2 and the seventh surface TA7-2. The edge of the fourth edge surface EG4-3 may have a concave shape when viewed in a plan view.

According to an exemplary embodiment of the current disclosure, an edge of a corner of a window member WM-3 of a display device DD (see FIG. 1) may have a concave shape. A case member CA (see FIG. 1) may be disposed on an edge of the display device DD (see FIG. 1). The case member CA (see FIG. 1) may include a material having a relatively higher rigidity than the window member WM-3. Accordingly, even when an external shock is applied to the edge of the display device DD (see FIG. 1), the probability that the external shock is transmitted to the window member WM-3 may be reduced. The probability that the window member WM-3 is damaged by the external shock applied to the edge may be reduced. Thus, the window member WM-3 having improved reliability and the display device DD (see FIG. 1) provided with the same may be provided.

According to exemplary embodiments of the current disclosure, a portion of a window member of a display device may be omitted. The probability that even when an external shock is applied to an edge, the shock is transmitted to a window member may be reduced. The probability that the window member is damaged due to the external shock applied to the edge may be reduced. Accordingly, the window member may prevent or reduce generation of a crack due to an external shock applied from the outside. Thus, the window member having improved reliability and the display device provided with the same may be provided.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A window member comprising:
   a main surface;
   a first surface adjacent to a first side of the main surface in a first direction;
   a second surface adjacent to the first surface in the first direction;
   a third surface adjacent to a second side crossing the first side of the main surface in a second direction crossing the first direction;
   a fourth surface adjacent to the third surface in the second direction; and
   a first edge surface adjacent to the first surface and the third surface,
   wherein the main surface and a flat surface portion of the second surface form a first angle of 60 degrees or more and 120 degrees or less, and
   wherein the main surface and a flat surface portion of the fourth surface form a second angle of 60 degrees or more and 120 degrees or less.

2. The window member of claim 1, further comprising:
   a fifth surface adjacent to the main surface in the first direction opposite to the first surface with respect to the main surface;
   a sixth surface adjacent to the fifth surface in the first direction; and
   a second edge surface adjacent to the third surface and the fifth surface.

3. The window member of claim 2, further comprising:
   a seventh surface adjacent to the main surface in the second direction opposite to the third surface with respect to the main surface;
   an eighth surface adjacent to the seventh surface in the second direction;
   a third edge surface adjacent to the first surface and the seventh surface; and
   a fourth edge surface adjacent to the fifth surface and the seventh surface.

4. The window member of claim 1, wherein an edge of the first edge surface has a convex shape in a plan view.

5. The window member of claim 1, wherein an edge of the first edge surface has a concave shape in a plan view.

6. The window member of claim 1, wherein the second surface is bent with respect to a first bending axis and the third surface is bent with respect to a second bending axis, and
   wherein the first bending axis is defined to overlap a boundary between the first surface and the second surface, and the second bending axis is defined to overlap a boundary between the third surface and the fourth surface.

7. The window member of claim 6, wherein the main surface, the first surface, the third surface, and the first edge surface are provided on a same plane.

8. The window member of claim 6, wherein the first bending axis and the second bending axis intersect at a position not overlapping the first edge surface in a plan view.

9. The window member of claim 1, wherein the first surface is bent with respect to a first bending axis, and the third surface is bent with respect to a second bending axis, and wherein the first bending axis is defined to overlap a boundary between the main surface and the first surface, and the second bending axis is defined to overlap a boundary between the main surface and the third surface.

10. The window member of claim 9, wherein the first bending axis and the second bending axis intersect at a position overlapping the first edge surface in a plan view.

11. The window member of claim 9, wherein a length of an arc formed on the first edge surface is smaller than or equal to 1 mm.

12. A display apparatus comprising:
a display panel; and a window member configured to cover the display panel, the window member comprising:
a main surface;
a first surface adjacent to a first side of the main surface in a first direction;
a second surface adjacent to the first surface in the first direction;
a third surface adjacent to a second side crossing the first side of the main surface in a second direction crossing the first direction;
a fourth surface adjacent to the third surface in the second direction; and
a first edge surface adjacent to the first surface and the third surface,
wherein the main surface and a flat surface portion of the second surface form a first angle of 60 degrees or more and 120 degrees or less, and
wherein the main surface and a flat surface portion of the fourth surface form a first angle of 60 degrees or more and 120 degrees or less.

13. The display apparatus of claim 12, wherein a shape of the display panel corresponds to a shape of the window member.

14. The display apparatus of claim 12, wherein an edge of the first edge surface has a convex shape in a plan view.

15. The display apparatus of claim 12, wherein an edge of the first edge surface has a concave shape in a plan view.

16. The display apparatus of claim 12, wherein the display panel is configured to display an image through the main surface, the first surface, the second surface, the third surface, and the fourth surface.

17. The display apparatus of claim 12, wherein the second surface is bent with respect to a first bending axis and the third surface is bent with respect to a second bending axis, and wherein the first bending axis is defined to overlap a boundary between the first surface and the second surface, and the second bending axis is defined to overlap a boundary between the third surface and the fourth surface.

18. The display apparatus of claim 17, wherein the first bending axis and the second bending axis intersect at a position not overlapping the first edge surface in a plan view.

19. The display apparatus of claim 13, wherein the first surface is bent with respect to a first bending axis, and the third surface is bent with respect to a second bending axis, and wherein the first bending axis is defined to overlap a boundary between the main surface and the first surface, and the second bending axis is defined to overlap a boundary between the main surface and the third surface.

20. The display apparatus of claim 19, wherein the first bending axis and the second bending axis intersect at a position overlapping the first edge surface in a plan view.

* * * * *